United States Patent
Uosaki et al.

(10) Patent No.: US 6,311,389 B1
(45) Date of Patent: Nov. 6, 2001

(54) GRADIENT MAGNETIC COIL APPARATUS AND METHOD OF MANUFACTURING THE SAME

(75) Inventors: Yasuhiro Uosaki; Kunio Watanabe, both of Nasu-gun; Masatoshi Yamashita, Otawara; Yoshitomo Sakakura, Nasu-gun, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/343,400

(22) Filed: Jun. 30, 1999

(30) Foreign Application Priority Data

Jul. 1, 1998 (JP) .................................................. 10-186463

(51) Int. Cl.$^7$ ........................................................ H01F 7/06
(52) U.S. Cl. ............................... 29/605; 29/605; 29/606
(58) Field of Search .......................................... 29/605, 606

(56) References Cited

U.S. PATENT DOCUMENTS

| | | | |
|---|---|---|---|
| 3,911,716 | * | 10/1975 | Weglin .................................. 72/324 |
| 3,932,928 | * | 1/1976 | King ..................................... 29/596 |
| 4,200,971 | * | 5/1980 | Shimizu ................................ 29/598 |
| 4,554,731 | * | 11/1985 | Borden ................................. 29/605 |
| 4,733,189 | * | 3/1988 | Punchard ............................. 324/318 |
| 4,737,716 | * | 4/1988 | Roemer ............................... 324/319 |
| 4,763,848 | * | 8/1988 | Bernhard .............................. 242/1 |
| 4,794,338 | * | 12/1988 | Roemer ................................ 324/39 |
| 4,840,700 | * | 6/1989 | Edelstein ............................. 156/634 |
| 4,847,985 | * | 7/1989 | Aubert .................................. 29/605 |
| 4,873,757 | * | 10/1989 | Williams ............................. 29/602.1 |
| 5,088,185 | * | 2/1992 | Siebold ................................ 29/605 |
| 5,111,172 | * | 5/1992 | Laskaris ............................... 335/216 |
| 5,349,744 | | 9/1994 | Takahashi . |
| 5,409,558 | * | 4/1995 | Takahasi ............................. 156/172 |

FOREIGN PATENT DOCUMENTS

| | | | |
|---|---|---|---|
| 55074126 | * | 6/1980 | (JP) . |
| 4-337614 | | 5/1991 | (JP) . |
| 04320314 | * | 11/1992 | (JP) . |

* cited by examiner

*Primary Examiner*—Lee Young
*Assistant Examiner*—Paul D. Kim
(74) *Attorney, Agent, or Firm*—Nixon & Vanderhye P.C.

(57) ABSTRACT

A curved metal plate is adhered to an outer surface of a cylindrical jig of the same shape, the metal plate is cut along the spiral coil winding pattern, the unnecessary metal portion other than the coil winding is peeled off from the jig to leave only the coil winding on the jig, an adhesive is applied on the coil winding, and an insulating sheet is covered over the jig (the coil winding thereon). After the coil winding is adhered to the insulating sheet, the insulating sheet (together with the coil winding) is peeled off from the jig. As a result, a saddle coil adhering the spiral coil winding to the inner side of the curved cylindrical insulating sheet is manufactured. According to such manufacturing method, without requiring huge equipment such as drying furnace, the saddle coil having a desired winding pattern with high precision can be manufactured in a short time and at low cost.

22 Claims, 4 Drawing Sheets

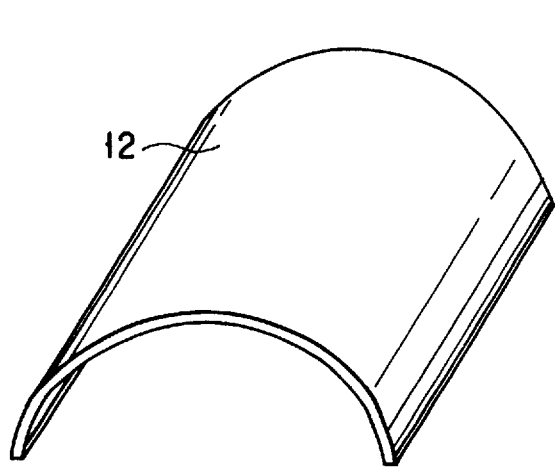
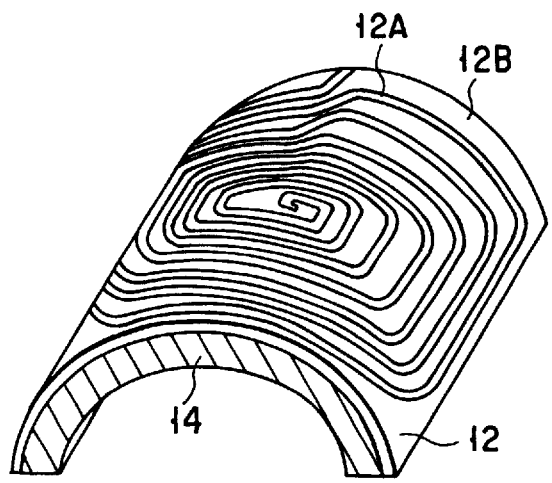
FIG. 1   FIG. 2
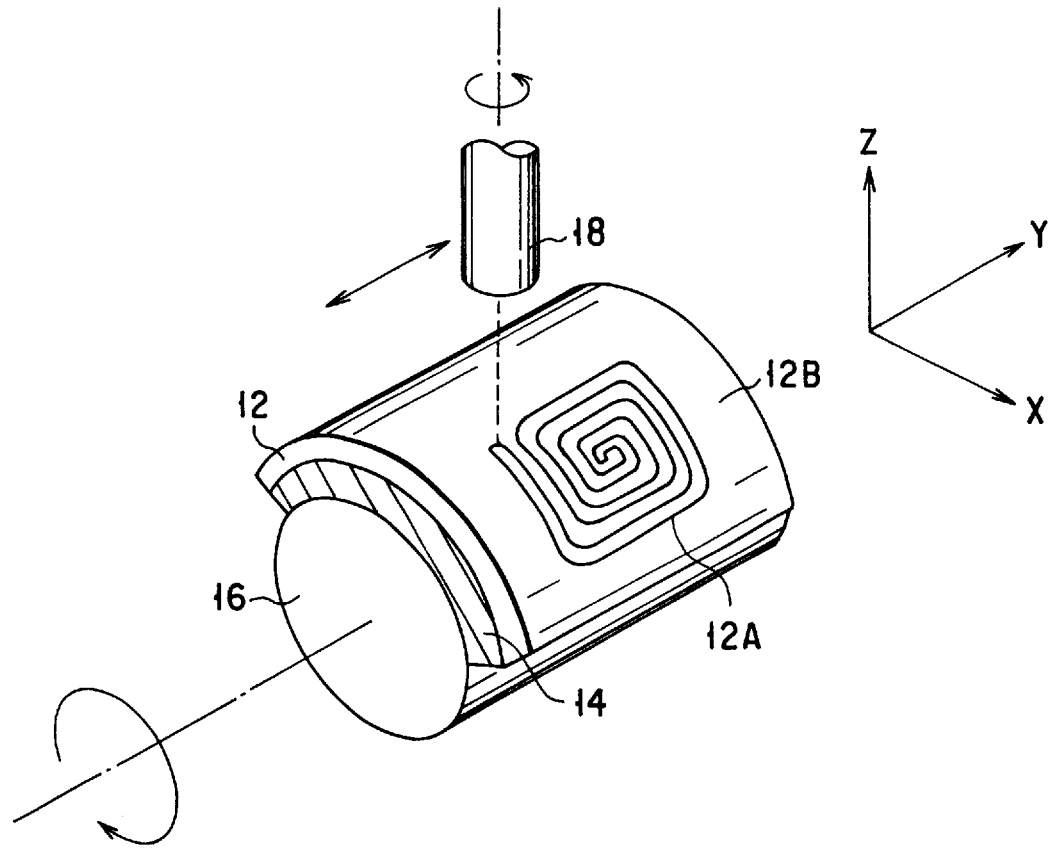
FIG. 3

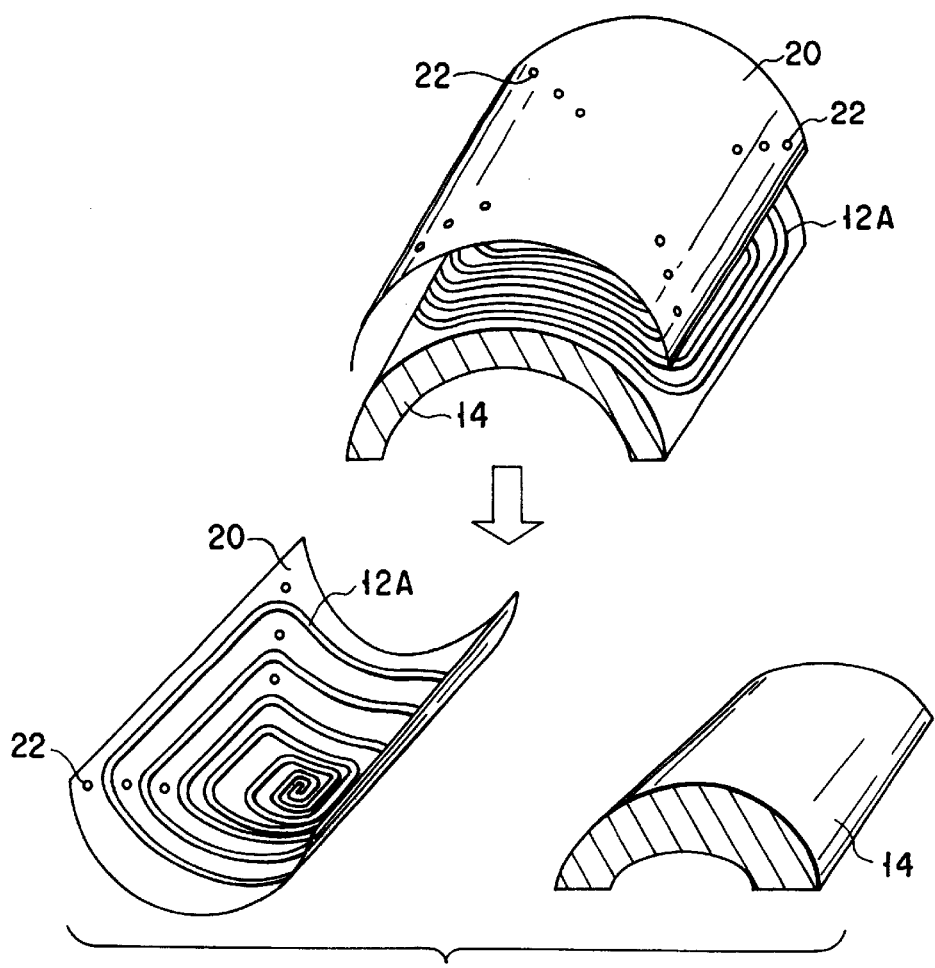
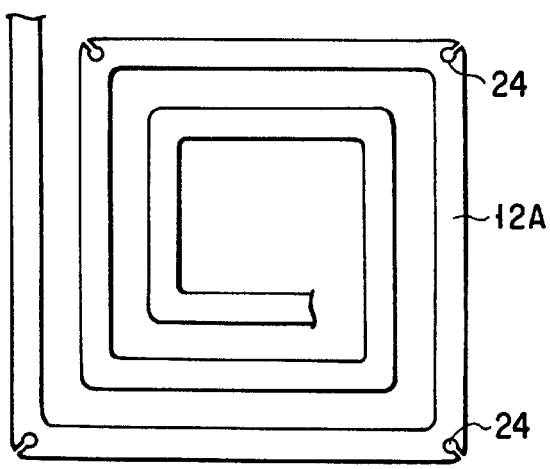
FIG. 4
FIG. 5A
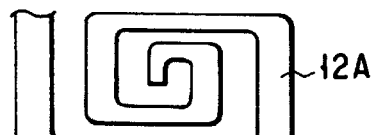
FIG. 5B
FIG. 5C

GRADIENT MAGNETIC COIL APPARATUS AND METHOD OF MANUFACTURING THE SAME

BACKGROUND OF THE INVENTION

The present invention relates to a coil apparatus such as gradient magnetic field coil apparatus of magnetic resonance imaging apparatus, and a method of manufacturing the same.

This application is based on Japanese Patent Application No. 10-186463, filed Jul. 1, 1998, the content of which is incorporated herein by reference.

In a magnetic resonance imaging apparatus, a gradient magnetic field coil is located inside of a magnet (superconductive magnet, ordinary conductive magnet, permanent magnet) for generating a static magnetic field. The gradient magnetic field coil is usually composed of three sets of coils called Gx, Gy, Gz coils, and a gradient magnetic field differing in the intensity linearly in each orthogonal direction of x-, y-, and z-axes. Herein, usually, the z-axis direction is the axial direction of the object, and the lateral direction (width direction) of the object is the x-axis direction, and the depth direction (thickness direction) of the object is the y-axis direction.

The gradient magnetic field has a linear inclination in the static magnetic field (principal magnetic field) for the purpose of arbitrarily determining the imaging section, or adding the position information to the RF signal from the object. A required performance of the gradient magnetic field coil includes the linearity of the gradient magnetic field in order to give accurate position information. The shape of the gradient magnetic field coil differs with the direction of the static magnetic field, and direction of inclination, but usually a pair of loop coils are used as Gz coil, and four saddle coil sets are generally used as Gx and Gy coils. Actually, moreover, outside of the gradient magnetic field coil, a shield coil of substantially the same shape is provided in order to prevent leak of magnetic field from the gradient magnetic field coil to outside.

The shape of the saddle coil is part of the surface of columnar or elliptical columnar form, and hence it is hard to manufacture. In a conventional manufacturing method of saddle coil, a coil winding of a specified pattern is cutout from a flat conductor thin plate, an insulating sheet is adhered to the surface of the coil winding, and it is pressed against a pressing die to curve, thereby forming a saddle coil (for example, U.S. Pat. No. 5,349,744). As the coil winding cutting-out method, a wire cutter, laser, or water jet cutter may be used, or a method of blanking a thin plate to a die having the coil shape groove, or a method of etching may be employed.

In such conventional methods, commonly, since a coil winding is cut out from a flat conductor plate, and then curved, the manufacturing process is complicated, and it takes many days, but the manufacturing error cannot be prevented. Yet, the winding extending in the cylindrical direction of the cylinder is curved, but the winding extending in the axial direction of the cylinder is not curved. Accordingly, gradient magnetic field having linearity of high precision cannot be generated. Further, if a thick conductor plate is required, curling in peripheral direction may be formed in the process of curving the coil winding, and it is hard to process into a desired shape.

Thus, the conventional manufacturing method of gradient magnetic field coil (such as called saddle coil) is complicated in manufacturing process, long in manufacturing time, and not free from manufacturing error.

BRIEF SUMMARY OF THE INVENTION

Accordingly, it is an object of the present invention to provide a manufacturing method capable of manufacturing a coil of desired shape in a short time and at high precision, and a coil apparatus using such coil.

According to the present invention, there is provided a manufacturing method of a coil comprising:

attaching a preliminarily curved metal plate on a jig;

cutting the metal plate along the contour of a spiral coil winding;

removing the unnecessary plate portion other than the coil winding of the metal plate from the metal plate and leaving only the coil winding on the jig;

connecting a support on the coil winding; and removing the coil winding from the jig.

According to the present invention, there is provided another manufacturing method of a coil comprising:

connecting a support on an inner surface of a preliminarily curved metal plate;

attaching the support on a jig;

cutting the metal plate along the contour of a spiral coil winding; and removing the unnecessary portion other than the coil winding of the metal plate from the support, and leaving only the coil winding on the support.

According to the present invention, there is provided a coil apparatus comprising first and second coil windings, being connected to generate a desired magnetic field, wherein the first and second coil windings are mutually connected with at least two electrical connections.

According to the present invention, there is provided another coil apparatus comprising a bobbin having a partial shape of cylindrical form, and a coil winding mounted on the bobbin, the coil winding including at least one of notch, protrusion and hole for positioning when mounting on the bobbin.

According to the present invention, there is provided a still another coil apparatus comprising a bobbin having a partial shape of cylindrical form, and a coil winding mounted on the bobbin, wherein both sides of a part of coil winding along an axial direction of the bobbin is orthogonal to a curved surface of the bobbin.

According to the present invention, there is provided a gradient coil apparatus comprising:

a bobbin having a partial shape of cylindrical form;

a primary coil, mounted on the bobbin, for generating a gradient magnetic field, the primary coil including coil windings having a partial shape of cylindrical form and arranged in a matrix, each of the coil windings having the same coil pattern, and innermost ends of two coil windings in the same row being connected through a conductor.

According to the present invention, there is provided an actively shielded gradient coil apparatus comprising:

a bobbin having a partial shape of cylindrical form;

a primary coil, mounted on the bobbin, for generating a gradient magnetic field, the primary coil including coil windings having a partial shape of cylindrical form and arranged in a matrix, each of the coil windings having the same coil pattern, and innermost ends of two coil windings in the same row being connected through a conductor; and a shield coil, mounted on the primary coil, for generating a magnetic field preventing leak of magnetic field from the primary coil, the shield coil including coil windings having a partial shape of cylindrical form and arranged in a matrix, each of the coil windings having the same coil pattern, and innermost ends of two coil windings in the same row being connected through a conductor.

According to the present invention, since the coil winding is formed by cutting a preliminarily curved metal plate, the manufacturing process is simple, and a coil having a desired surface shape can be manufactured in a short time.

According to the present invention, since the coil winding has notch, protrusion or hole for positioning, the coil winding can be fixed to the bobbin with high precision, thereby enabling to generate a magnetic field in a desired distribution pattern with high precision.

According to the present invention, portions of the coil winding which along an axial direction of the bobbin is curved and the side faces of that portion are orthogonal to a plane of curvature of the bobbin. Therefore, it is also possible to generate a magnetic field in a desired distribution pattern with high precision.

Additional objects and advantages of the present invention will be set forth in the description which follows, and in part will be obvious from the description, or may be learned by practice of the present invention.

The objects and advantages of the present invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 1 is a diagram showing a bent copper plate to be used in a manufacturing method of saddle coil according to the invention;

FIG. 2 is a diagram showing the state of the copper plate being cut off according to the coil pattern by adhering the copper plate shown in FIG. 1 on a jig;

FIG. 3 is a diagram showing an outline of a milling machine used in cutting of copper plate as shown in FIG. 2;

FIG. 4 is a diagram showing a process of completing a saddle coil by removing unnecessary portion from the copper plate after the milling process, and adhering a coil winding to an insulating sheet;

FIGS. 5A, 5B, and 5C are plan views showing specific examples of coil pattern;

DETAILED DESCRIPTION OF THE INVENTION

Figure 6A:
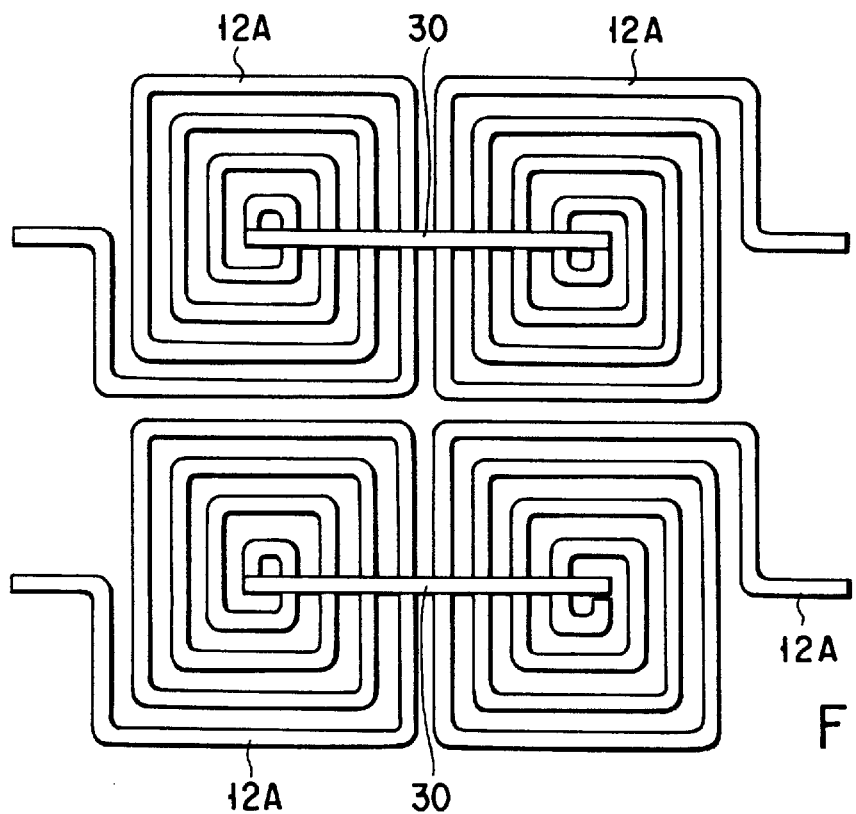
FIGS. 6A and 6B are diagrams showing gradient magnetic field coils manufactured by combining four saddle coil sets.

A preferred embodiment of a coil apparatus according to the present invention will now be described with reference to the accompanying drawings. Herein, the coil apparatus refers to an example of saddle coils Gx and Gy for forming a gradient magnetic field coil apparatus of a magnetic resonance imaging apparatus.

A feature of the invention lies in manufacture of coil winding by cutting a metal plate (herein, a copper plate) preliminarily bent in a cylindrical surface shape or an elliptical cylindrical surface shape conforming to the shape of a saddle coil, according to a spiral coil pattern, and removing unnecessary parts.

FIG. 1 shows a copper plate 12 preliminarily bent. It is bent into a cylindrical shape having a specified radius of curvature by a roller processing machine. The shape is not limited to a cylindrical form, but may be an elliptical cylindrical form.

This copper plate 12 of cylindrical surface shape is fixed, for example, adhered on an outer surface of a jig 14 of the same shape having a certain thickness. For fixing, either adhesive or both-side adhesive tape may be used. The adhesion is required to be strong enough so that the copper plate 12 may not be deviated in position from the jig 14, but may be weak enough to be easily separated by hand from the jig 14 by the worker.

The jig 14 to which this copper plate 12 is adhered is installed in a milling machine as shown in FIG. 3, and the copper plate 12 is cut along a spiral coil pattern contour, and a coil winding made of a copper plate of specified width is formed. The milling machine comprises a mandrel 16 for fixing the jig 14 and an end mill 18 for cutting the copper plate. The mandrel 16 can be rotated about the Y-axis. The end mill 18 rotates about the Z-axis, and the spindle unit (not shown) on which the end mill 18 is mounted can be moved in the directions of X-, Y- and Z-axes.

The coil pattern is drawn on the copper plate 12 by Y-axis rotation of the mandrel 16 and Y-axis movement of the spindle unit. This rotation and movement can be controlled at high precision and easily, by numerical control system. In the mandrel 16, since the end mill 18 is positioned in a direction orthogonal to the plane of its curvature, the both sides (or cutting faces) of the coil winding 12A is orthogonal to the plane of curvature of the copper plate 12. Accordingly, as compared with the prior art of cutting out a coil winding from a flat conductor and the curving (in this case, the cutting end face of the coil winding is not orthogonal to the plane of curvature, or even a plane of curvature is not formed), a gradient magnetic field of higher precision may be generated.

Thus, in this embodiment, since the coil winding is formed by cutting off a curved copper plate, the degree of freedom is higher as compared with the conventional method of winding the copper wire along a desired coil pattern. That is, in such conventional method, the thickness of the winding is uniform, while the width of the winding may be varied in this embodiment. Therefore, hitherto, the width of the winding was determined in accordance with the highest density of winding, but in this embodiment, the coil pattern may be designed freely so that the width of the coil winding may be smaller at a position of a high density of winding, and larger at a position of a low density.

In the coil winding of such variable width, as compared with the coil winding of fixed width, the electric resistance of the coil can be lowered, and heat generation (Joule heat) of the coil may be lowered. Moreover, direct-current loss of the supply voltage can be decreased, and a higher slew rate (mT/m/ms) as compared with the coil winding of fixed width can be obtained.

Because of very high speed cutting, the cutting section is very smooth, free from burr or the like. Also by high speed cutting, a considerably thick copper plate can be cut off, and as compared with the process of etching the copper plate and forming a coil winding, a thick coil winding can be formed. In the case of etching, each coil winding is formed of two layers, but in this embodiment, a coil winding can be formed of one layer of copper plate, and the work is easy and the precision of coil pattern is enhanced. Further, in the case of etching, the etching speed differs between the surface and the middle thickness portion, and burrs are left over on the surface, and insulation breakdown may occur therein. FIG. 2 shows a state of cutting the copper plate 12 along the contour of coil pattern.

Referring next to FIG. 4, a manufacturing process of saddle coil, such as Gx or Gy coil, is described. After cutting off the contour of coil winding, the copper plate 12 is taken out from the milling machine together with the jig 14, and the unnecessary metal portion 12B (see FIG. 2) other than the coil winding is removed from the copper plate 12, and only the spiral coil winding 12A is left over on the jig 14. An adhesive is applied on this coil winding 12A, and an insulating sheet 20 is covered over the jig 14, and the coil winding 12A is adhered to the insulating sheet 20. The adhesive for adhering the insulating sheet 20 and coil winding 12A has a stronger adhesion than the adhesive for adhering the copper plate 12 and jig 14 shown in FIG. 2. That is, when the insulating sheet 20 is peeled off the jig 14, the copper plate 12 (coil winding 12A) is peeled off the jig 14, and is adhered to the insulating sheet 20 side. The adhesive applied on the coil winding 12A is required to have such a viscosity that it may not spread over to the surface of the jig 14 other than the coil winding 12A. Accordingly, the insulating sheet 20 is adhered only to the coil winding 12A, and is not adhered to the jig 14.

After the coil winding 12A is adhered to the insulating sheet 20 (scores of minutes later in this embodiment), when the insulating sheet 20 is peeled off the jig 14, the spiral coil winding 12A is adhered to the curved cylindrical inner surface of the insulating sheet 20, and thus a saddle coil is formed. In the insulating sheet 20, tiny holes 22 are formed at four corners on diagonal lines, and they are for the purpose of impregnation as mentioned later. Hence, the positions of the holes 22 are portions free from coil winding 12A. Alternatively, these holes 22 may be opened immediately before impregnation after laminating the saddle coil on a cylindrical bobbin.

FIGS. 5A, 5B, and 5C show specific patterns of coil winding 12A. The coil winding shown in FIG. 5A has positioning notches 24 provided at four corners. These notches 24 are, as described later, for engaging a positioning jig when laminating the saddle coil on the cylindrical bobbin and manufacturing a gradient magnetic field coil apparatus. Holes may be formed instead of notches, but notches can be cut off continuously together with the contour of coil winding at the same time, and the manufacturing time can be shortened. Further, protrusions may be formed instead of holes or notches.

FIG. 5B shows a coil pattern in which the width of the coil winding is small where the density of winding is high, and large where the density is low.

FIG. 5C also shows a coil pattern changing in the width of the coil winding similar to that in FIG. 5B. In the coil pattern in FIG. 5B, the width of coil winding is varied intermittently (a specific broad width in a certain portion, and a specific narrow width in other portion), whereas the width of the coil winding is changed continuously in the coil pattern in FIG. 5C.

Figure 6B:
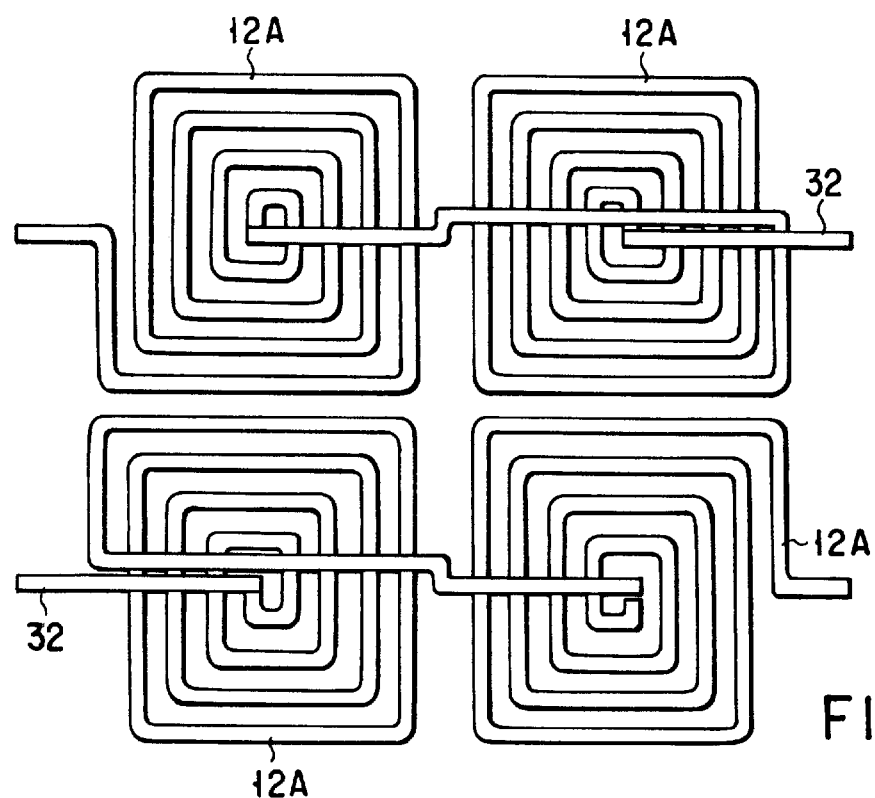

In an actual gradient magnetic field coil apparatus, four gradient magnetic field coils thus formed are combined, and Gx coil or Gy coil is formed. Two examples of combination are shown in FIGS. 6A and 6B. In the example in FIG. 6A, four coil windings of completely identical coil pattern are arranged to generate a desired gradient magnetic field. The innermost ends of two coil windings 12A arranged in the lateral direction in the diagram are connected to each other through a transit wire 30 made of conductor (for example, copper wire, copper processed wire: square wire). The transit wire 30 and the winding can be connected by soldering, screw fastening, welding, brazing, etc. That is, the number of electrical connections between the transit wire 30 and the coil windings 12A is at least two.

In the example in FIG. 6B, four coil windings having two coil patterns are used to generate a desired gradient magnetic field. The innermost end of one coil of the two saddle coils arranged in the lateral direction is connected to the outermost end of other coil. When the outer end is made somewhat longer, it can be connected directly without using transit wire. The innermost end of the other coil is connected to one end of a lead wire 32.

Figure 7:
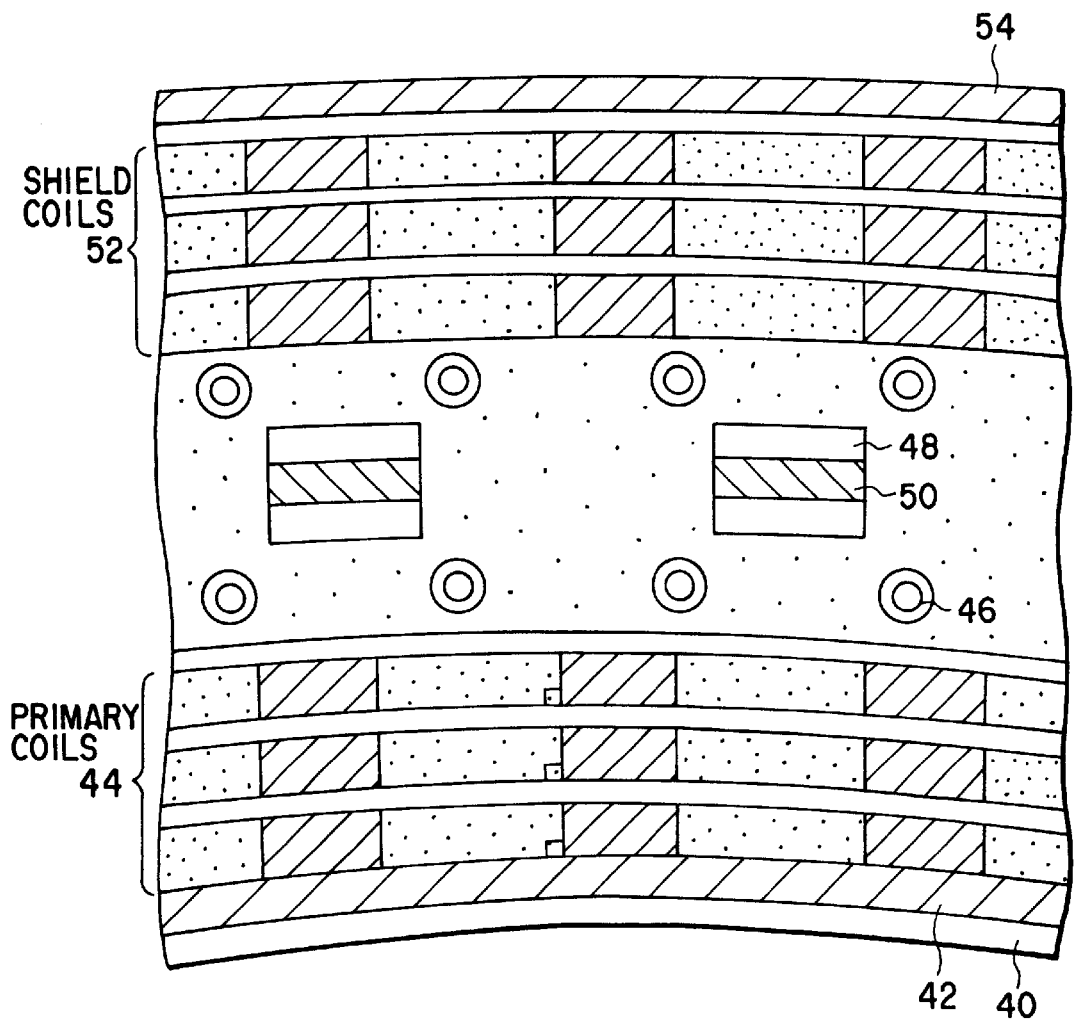
FIG. 7 is a sectional view showing a structure of a gradient magnetic field coil apparatus.

As shown in FIG. 7, on the cylindrical bobbin 40, Gx coil, Gy coil and Gz coil are mounted in this order (or in other order) as primary coils 44, and further cooling tubes 46 and a structure 48 mounting a magnetic element 50 for correcting static magnetic field are arranged, and further Gx coil, Gy coil and Gz coil are mounted thereon as shield coils 52 corresponding to the primary coils, and a shim coil (as correcting means for uniformity of static magnetic field) 54 is provided at the outermost side. By making use of the positioning notches 24 formed in the coil winding, the coil winding is positioned on the bobbin. After positioning the coil windings on the bobbin, the transit wire 30 is connected to the coil windings. It is possible to connect the transit wire 30 to the coil windings before positioning. Then, the entire structure is impregnated in an insulator (for example, epoxy resin), and the space between the coil windings or between the primary coils 44 and shield coils 52 is filled with insulator, and a gradient magnetic field coil apparatus is completed. In this gradient magnetic field coil apparatus, since the magnetic field is generated from the shield coils in order to shield the magnetic field from the primary coils, it is called the actively shield gradient magnetic field coil (ASGC). The cooling medium flowing in the cooling pipes 46 may be water, coolant, cold air, etc.

According to the manufacturing method of the first embodiment, the following effects are brought about.

(a) Since the coil winding is formed by cutting a preliminarily curved metal plate, the manufacturing process is simple, and the coil having an arbitrary surface shape can be manufactured in a short time.

(b) Since the curved metal plate is cut along the coil pattern by the numerically controlled milling machine, a coil winding with high precision is realized.

(c) Further, a coil winding of desired pattern can be cut off from a copper plate of an arbitrary surface shape. By varying the width of the winding depending on positions, e.g., the density of winding, the electric resistance value and Joule heat can be lowered, while the slew rate can be heightened.

(d) Since a coil winding can be manufactured so that the side faces of the coil winding along an axial direction of the bobbin are orthogonal to a plane of curvature of the bobbin and the upper and lower faces are along the curvature of the bobbin as shown in FIG. 7, the shape of the coil can be precise as designed and an ideal magnetic filed can be produced.

The invention is not limited to the illustrated embodiment alone, but may be modified in various forms. For example, in the above explanation, (1) after adhering the metal plate on the outer surface of the jig of the same shape, the metal plate is cut along the contour of the spiral coil winding, and (2) the unnecessary metal portions other than the coil winding is removed, and only the coil winding is left over on the jig, and the insulating sheet is covered over, and the coil winding is transferred (adhered) from the jig onto the insulating sheet. But the sequence of the cutting process (1) and adhesion of insulating sheet (2) may be inverted. That is, (1') the insulating sheet is covered over the inner surface of the preliminarily curved metal plate, the insulating sheet and metal plate are adhered, and the insulating sheet is fixed on the outer surface of the jig of the same shape, (2') the metal plate is cut along the winding pattern of spiral coil, and (3') the unnecessary metal portion other than the coil winding is removed from the insulating sheet, and only the coil winding is left over on the insulating sheet. In this manufacturing method, too, the similar saddle coil can be obtained. In this case, however, the insulating sheet is positioned at the inner side of the cylindrical coil winding. In the above embodiment, the insulating sheet is positioned at the outer side of the cylindrical coil winding. Alternatively, (1") the insulating sheet is covered over the outer surface of the preliminarily curved metal plate, and the insulting sheet and the metal plate are adhered, (2") the insulating sheet is adhered on the inner surface of the jig of the same shape as the metal plate, (3") the jig is mounted on the milling machine, and the metal plate is cut along the spiral coil winding pattern from the inner side of the curved surface, and (4") the unnecessary metal portion other than the coil winding is removed from the insulating sheet, and only the coil winding is left over on the insulating sheet. According to this manufacturing method, since the insulating sheet is positioned at the outer side of the cylindrical coil winding, the saddle coil of the same constitution as above can be obtained.

In the above description, the gradient magnetic field coil is mentioned, but not limited to this, the invention may be applied also to the shim coil, RF coil, or static magnetic field coil, as far as the coil has a curved surface (not limited to saddle shape).

According to the invention, as described above, since coil winding is formed by cutting the preliminarily curved metal plate along the coil pattern, a saddle coil of a desired shape is realized at high precision and in a simple process.

What is claimed is:

1. A manufacturing method for a coil, said method comprising: attaching a curved metal plate on a jig;
   cutting the metal plate along the contour of a spiral coil winding;
   removing the unnecessary plate portion other than the coil winding of the metal plate from the metal plate leaving the coil winding on the jig;
   connecting a support on the coil winding; and then
   removing the coil winding from the jig.

2. The manufacturing method of claim 1, wherein the metal plate is preliminarily bent and processed into a cylindrical form or an elliptical cylindrical form having an arbitrary radius of curvature.

3. The manufacturing method of claim 1, wherein the metal plate is adhered to the jig by using an adhesive or double-sided adhesive tape having a first adhesion not causing deviation of plate position with respect to the jig but allowing cut plate portions to be removed from the jig.

4. The manufacturing method of claim 3, wherein the support is adhered to the coil winding by an adhesive or double-sided adhesive tape having a second adhesion stronger than the first adhesion.

5. The manufacturing method of claim 4, wherein the adhesive having the second adhesion has a viscosity sufficient not to spread substantially to jig surfaces outside the coil winding.

6. The manufacturing method of claim 1, wherein the metal plate is cut along the contour of a spiral coil winding by milling.

7. The manufacturing method of claim 1, wherein the spiral coil winding partially differs in density of winding, with winding width being narrow where the density is high and winding width being broad where the density is low.

8. The manufacturing method of claim 1, wherein said support is an insulator.

9. A manufacturing method for a coil, said method comprising:
   connecting a support on an inner surface of a curved metal plate;
   attaching the support on a jig;
   cutting the metal plate along the contour of a spiral coil winding; and
   removing the unnecessary portion other than the coil winding of the metal plate from the support leaving the coil winding on the support.

10. The manufacturing method of claim 9, wherein the metal plate is preliminarily bent and processed into a cylindrical form or an elliptical cylindrical form having an arbitrary radius of curvature by roll processing.

11. The manufacturing method of claims 9, wherein the support is adhered to the metal plate by using an adhesive or double-sided adhesive tape having a first adhesion not causing deviation of plate position with respect to the metal plate but allowing cut portions to be removed from the metal plate.

12. The manufacturing method of claim 11, wherein the support is adhered to the jig by using an adhesive or double-sided adhesive tape having a second adhesion weaker than the first adhesion.

13. The manufacturing method of claim 12, wherein the adhesive having the second adhesion has a viscosity sufficient not to spread substantially to jig surfaces outside the coil winding.

14. The manufacturing method of claim 9, wherein the metal plate is cut along the contour of a spiral coil winding by milling, using an end mill.

15. The manufacturing method of claim 9, wherein the spiral coil winding partially differs in density of winding, the winding width being narrow where density is high and winding width being broad where density is low.

16. The manufacturing method of claim 9, wherein said support is an insulator.

17. A manufacturing method for a coil, said method comprising:
   bending a metal plate in a predetermined curved shape; and
   removing an unnecessary portion from the curved metal by a machining process plate leaving a predetermined coil pattern of the plate.

18. The manufacturing method claim 17, wherein the metal plate is bent to a cylindrical form.

19. The manufacturing method of claim 17, wherein the metal plate is bent to an elliptical cylindrical form.

20. A manufacturing method for a coil, said method comprising:

attaching a curved metal plate to a curved jig;

cutting the metal plate along the contour of a spiral coil winding;

removing an unnecessary plate portion other than the coil winding from the metal plate leaving the coil winding on the jig;

attaching a curved support to an outer surface of the coil winding on the jig; and removing the support together with the coil winding from the jig.

21. A manufacturing method for a coil, said method comprising:

attaching a curved support to an inner surface of a preliminarily curved metal plate;

attaching the support to a curved jig;

cutting the metal plate along the contour of a spiral coil winding by a machining process; and removing an unnecessary plate portion other than the coil winding from the support leaving the coil winding on the support.

22. A method for manufacture of an electromagnetic coil for an MRI system, said method comprising:

cutting through a curved conductive plate along a coil winding pattern forming cut-edges that are orthogonal to an adjacent curved surface of the plate; and separating thusly cut portions of the curved plate to provide a curved MRI electromagnetic coil having said winding pattern.

* * * * *